(12) United States Patent
Takeyabu et al.

(10) Patent No.: US 6,642,871 B2
(45) Date of Patent: Nov. 4, 2003

(54) ANALOG/DIGITAL CONVERTER WITH ERROR AUTOMATIC CALIBRATION FUNCTION

(75) Inventors: Masato Takeyabu, Hokkaido (JP); Yuji Kobayashi, Hokkaido (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/268,157

(22) Filed: Oct. 10, 2002

(65) Prior Publication Data

US 2003/0184466 A1 Oct. 2, 2003

(30) Foreign Application Priority Data

Mar. 29, 2002 (JP) ........................................ 2002-095366

(51) Int. Cl.[7] .............................................. H03M 2/10
(52) U.S. Cl. ...................... 341/120; 341/118; 341/156; 341/161; 341/162
(58) Field of Search ............................... 341/118, 120, 341/156, 161, 162

(56) References Cited

U.S. PATENT DOCUMENTS

| | | | | |
|---|---|---|---|---|
| 4,535,319 A | * | 8/1985 | Penney | 341/156 |
| 4,908,621 A | * | 3/1990 | Polonio et al. | 341/120 |
| 5,043,732 A | * | 8/1991 | Robertson et al. | 341/156 |
| 5,047,772 A | * | 9/1991 | Ribner | 341/156 |
| 6,211,806 B1 | * | 4/2001 | McCarroll | 341/161 |
| 6,486,807 B2 | * | 11/2002 | Jonsson | 341/120 |
| 6,489,904 B1 | * | 12/2002 | Hisano | 341/120 |

* cited by examiner

*Primary Examiner*—Michael Tokar
*Assistant Examiner*—Nguyen Khai
(74) *Attorney, Agent, or Firm*—Katten Muchin ZavisRosenman

(57) ABSTRACT

The present invention relates to an analog/digital converter including an analog conversion unit including a plurality of stages having a pipelined configuration and a digital conversion unit. The digital conversion unit has digital-value storage registers, which are each provided for one of the stages. Each of the register is used for storing a digital value completing error correction for each segment, and adapted to output the digital value that corresponds to a segment number. The digital conversion unit also has an error-computation control unit, which controls the stages so that a specific one of the stages, inputs an error computation analog signal. The error-computation control unit then computes an error of the specific stage on the basis of digital-converted data computed from the digital values corresponding to segment numbers received from all the stages following the specific stage.

12 Claims, 12 Drawing Sheets

Gain error coefficient of 1.25

A gain error and an offset exist in the first stage

Gain error coefficient of 1.25

Offset coefficient $\begin{cases} +0.02 \text{(Segment 0)} \\ -0.03 \text{(Segment 1)} \\ +0.01 \text{(Segment 2)} \end{cases}$

ANALOG/DIGITAL CONVERTER WITH ERROR AUTOMATIC CALIBRATION FUNCTION

BACKGROUND OF THE INVENTION

1. Field of the Invention

The present invention relates an analog/digital converter having an error automatic calibration function.

2. Description of the Related Art

A pipeline-connection analog/digital (A/D) converter is used for carrying out analog/digital conversion at a high speed. In a pipeline-connection A/D converter, digital outputs of pipeline-connected analog stages are summed up by pipeline-connected adders in order to increase the speed of the conversion. At the same time, there is a demand for enhancement of the precision of digital data obtained as a result of the analog/digital conversion. In order to improve the precision, there has been proposed a method of correcting errors caused by the analog/digital conversion technique and hardware implementing the analog/digital converter. In accordance with an A/D conversion technique whereby an analog signal is divided into three segments separated from each other by a threshold and codes of 1 and 0 are assigned to the two segments, if the threshold includes an error component, an analog signal close to the threshold is converted into digital data having poor precision. In order to solve this problem, there has been proposed an A/D conversion technique such as a 1.5-bit A/D conversion technique as is described in the IEEE Journal of Solid-State Circuit, Vol. 34, No. 5, May 1999 and the IEEE Communication Magazine, October 1999 whereby an analog level is divided into three or more segments and a digital value is assigned to each of the segments. The IEEE journal and the IEEE magazine are referred to hereafter as reference 1 and reference 2 respectively.

In accordance with the 1.5-bit A/D conversion technique, the level of an analog signal in the range [−VR, VR] is divided into three segments, namely, segment 0, segment 1 and segment 2, which cover levels in the ranges [−VR, −VR/4], [−VR/4, VR/4] and [VR/4, VR] respectively. A/D conversion is carried out by summing up digital values assigned to segments 0, 1 and 2.

Each stage comprises a sub-ADC (sub-analog/digital converter), a sub-DAC (sub-digital/analog converter), an adder and an operational amplifier. The sub-ADC outputs a segment number indicating which of segments 0 to 2 the level of an analog signal is in. The sub-DAC outputs a second analog signal corresponding to the segment number to the adder. For example, in the case of segment 0, a VR/2 second analog signal is output to the adder. In the case of segment 1, a 0 second analog signal is output to the adder and, in the case of segment 2, a −VR/2 second analog signal is output to the adder. The adder adds the second analog signal to the analog signal. The operational amplifier amplifies the output of the adder at a predetermined gain of typically 2 and outputs the amplified signal to the next stage.

In the case of a stage with such a configuration, an error is inevitably generated in digital data obtained as a result of conversion of an input analog signal due to a gain error of an amplifier and mismatching caused by variations in capacity of a capacitor employed in the adder. It is thus necessary to correct the error. Reference 2 discloses correction of errors by correction of the error of the gain of the amplifier at an analog circuit level. Japanese Patent Laid-open No. Hei 11-274927 discloses a technique of correction whereby mismatching of a capacitor at each stage and an error of the gain of an amplifier at each stage are measured and converted into digital data to be stored in a memory. The digital data obtained as a result of the measurement is multiplied by digital data obtained as a result of conversion to find an error term, which is added to the digital data obtained as a result of conversion. Japanese Patent Laid-open No. Hei 11-274927 is referred to as reference 3.

Since the error correction technique disclosed in reference 2 is a technique to correct an error at an analog level, however, there is raised a problem of a complicated analog circuit. In the case of the correction disclosed in reference 3, a correction value for correcting a difference in capacitor storage capacity and for correcting an error of the gain of an amplifier needs to be computed by multiplication each time A/D conversion is carried out. Since the multiplication of a correction value consumes much power in comparison with addition and subtraction processing and a bit-shift operation, however, there is raised a problem that a battery is exhausted in a short period of time caused by the large power consumption for devices requiring low power consumption. An example of such devices is a mobile phone.

SUMMARY OF THE INVENTION

It is thus an object of the present invention to provide an A/D converter having an error automatic calibration function capable of reducing power consumption.

In accordance with an aspect of the present invention, there is provided an analog/digital converter comprising an analog conversion unit including a plurality of stages having a pipelined configuration and a digital conversion unit, wherein each of the stages includes: a sub-analog/digital converter for outputting a segment number corresponding to the level of a first analog signal; a sub-digital/analog converter for outputting a second analog signal corresponding to the segment number; and an amplifier circuit for adding the second analog signal to the first analog signal to produce a sum analog signal and amplifying the sum analog signal at a predetermined gain, and wherein the digital conversion unit includes: digital-value storage registers, which are each provided for one of the stages, each of the registers used for storing a digital value completing error correction for a segment and being adapted to output the digital value that corresponds to the segment number, an addition-processing unit for summing up the digital values output for all the stages from the specific digital-value storage registers to output digital-converted data; and an error-computation control unit for controlling the stages so that a specific one of the stages inputs an error computation analog signal, computing an error of the specific stage on the basis of the digital-converted data computed by the addition-processing unit by summing up the digital values output by the digital-value storage registers, in accordance with the segment numbers received from all the stages following the specific stage and updating the digital values stored in the digital-value storage registers associated with all the stages following the specific stage in order to cancel the error of the specific stage.

Preferably, the error-computation control unit controls the specific stage in order to compute an actual gain of the amplifier circuit employed in the specific stage from the digital-converted data, computes a ratio of the computed actual gain to an ideal gain of the amplifier circuit employed in the specific stage, and updates the digital values stored in the digital-value storage registers associated with all the stages following the specific stage.

Preferably, the error-computation control unit updates the digital value stored in the digital-value storage register which is associated with the specific stage and which is associated with a particular segment, so that the digital-converted data becomes equal to a predetermined digital value when an input analog signal at a particular level corresponding to the particular segment is supplied to the specific stage.

The above and other objects, features and advantages of the present invention and the manner of realizing them will become more apparent and the invention itself will be best understood from a study of the following description and appended claims with reference to attached drawings showing some preferred embodiments of the invention.

DETAILED DESCRIPTION OF THE PREFERRED EMBODIMENTS

Figure 1:
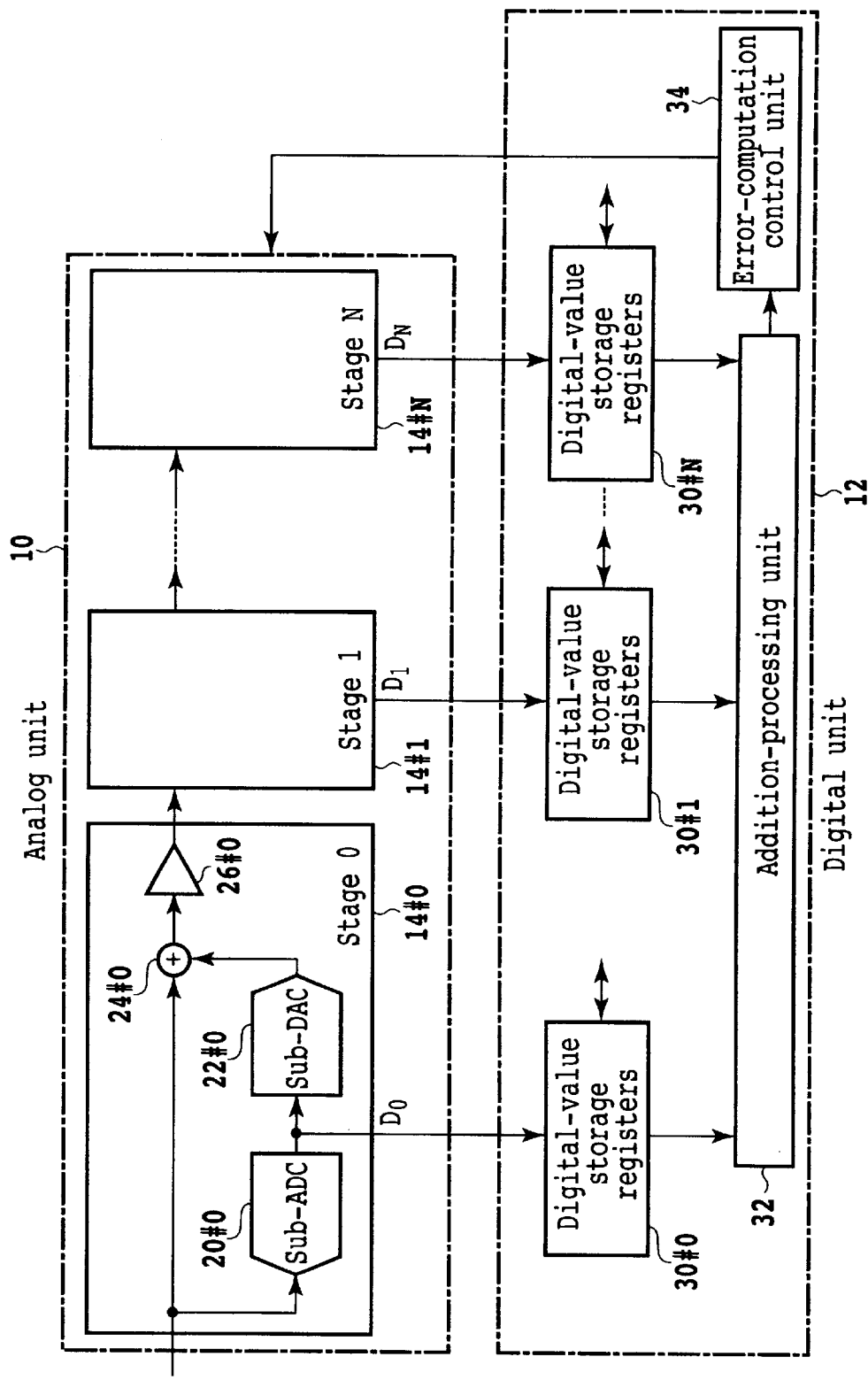
FIG. 1 is a block diagram showing the principle of the present invention.

Before explaining preferred embodiments of the present invention, the principle of the invention is enlightened. FIG. 1 is a block diagram showing the principle of the present invention. As shown in FIG. 1, an A/D converter comprises an analog unit 10 and a digital unit 12. The analog unit 10 comprises stages 14#i forming a pipeline where i=0 to N. Each of the stages 14#i comprises a sub-ADC 20#i, a sub-DAC 22#i, an adder 24#i and an operational amplifier 26#i. On the other hand, the digital unit 12 comprises sets of digital-value storage registers 30#i where i=0 to N, an addition-processing unit 32 and an error-computation control unit 34. The sub-ADC 20#i determines the level of a first analog signal and outputs a segment number Di. The sub-DAC 22#i outputs a second analog signal corresponding to the segment number Di. Assume that the level of the first analog signal lies in the range [−VR, VR]. In this case, for a segment number of 0, the sub-DAC 22#i outputs a second analog signal of +VR/2. For a segment number of 1, the sub-DAC 22#i outputs a second analog signal of 0 and, for a segment number of 2, the sub-DAC 22#i outputs a second analog signal of −VR/2.

Figure 2:
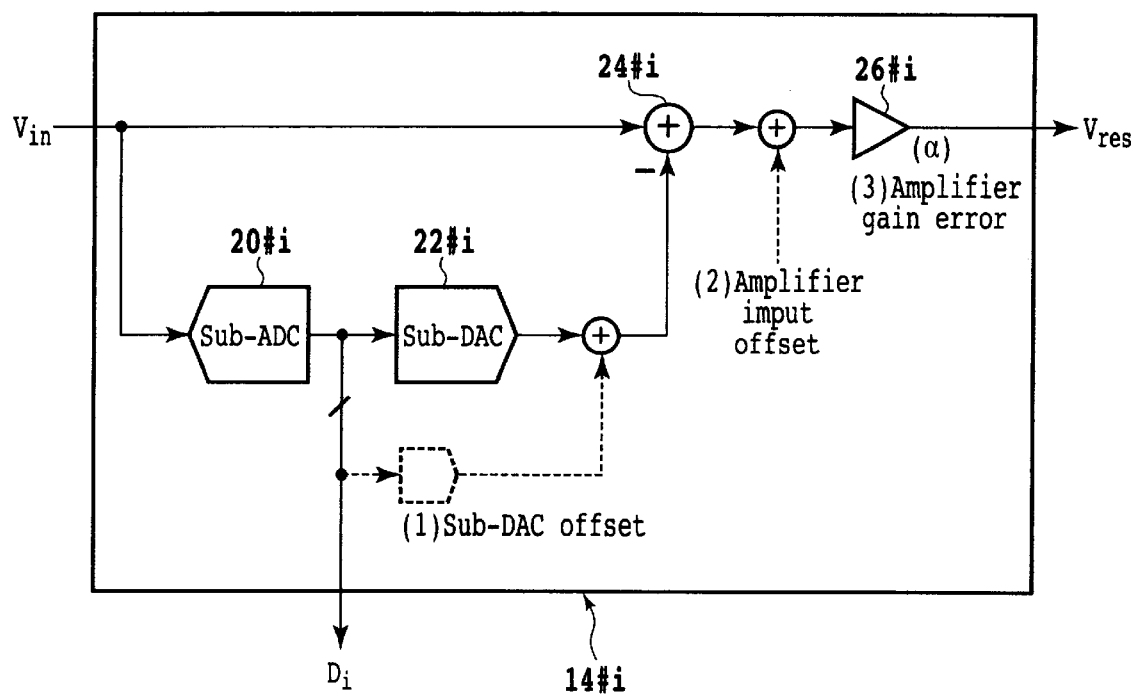
FIG. 2 is a diagram showing an error generated in a stage.

The adder 24#i adds the second analog signal to the first analog signal. The operational amplifier 26#i amplifies a signal output by the adder 24#i at a predetermined gain of typically 2. The digital-value storage register 30#i is used for storing a digital value corresponding to a segment number Di for each segment in advance, and outputs the digital value corresponding to the input segment number Di. The addition-processing unit 32 sums up the digital values to produce digital-converted data. FIG. 2 is a diagram showing an error generated in the stage 14#i. There are the following 3 kinds of error to be corrected:

(1): Sub-DAC Offset

Normally, since a potentiometer output is shared by the sub-DACs 20#i of all the stages 14#i where i=0 to N, an error of a fixed magnitude is generated in each of the stages 14#i. However, the sub-DAC offset varies in dependence on whether the segment number Di is 0, 1 or 2.

(2): Amplifier Input Offset

The amplifier input offset is similar to the sub-DAC offset except that the amplifier input offset is fixed regardless of whether the segment number Di is 0, 1 or 2.

(3): Amplifier Gain Error

The amplifier gain error is caused by a capacitance relative error of a switched capacitor, a switch feed-through and amplifier-gain limitedness. The amplifier gain error appears as an error of the gradient of a stage input-output characteristic straight line.

Figure 3A:
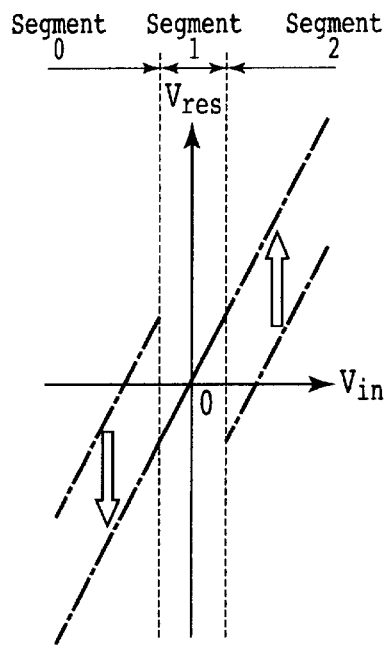
FIG. 3A is a diagram showing a correction method adopted for a stage.
Figure 3B:
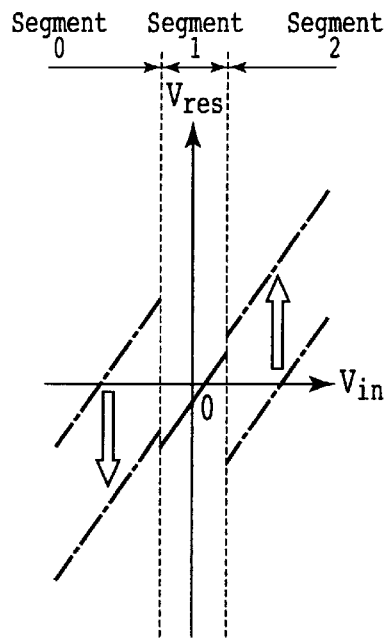
FIG. 3B is a diagram showing a correction method adopted for a stage.
Figure 3C:
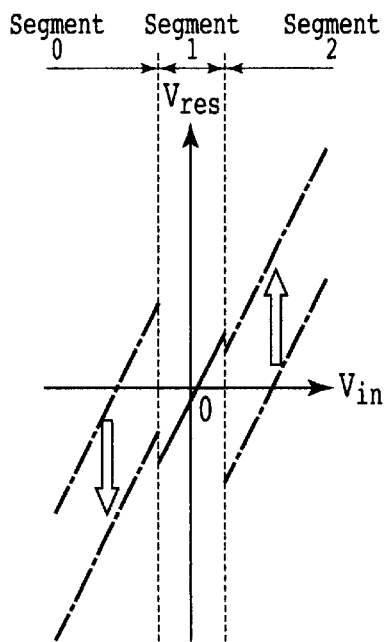
FIG. 3C is a diagram showing a correction method adopted for a stage.
Figure 3D:
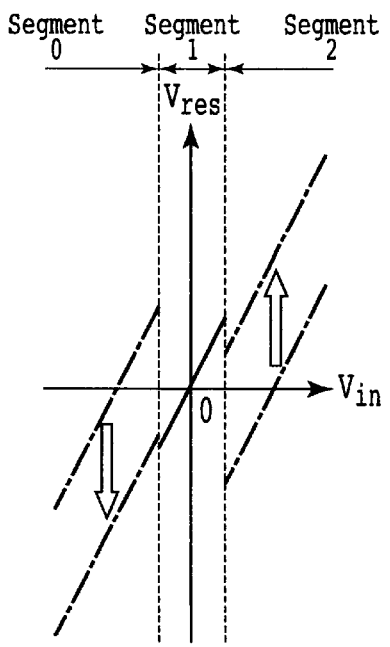
FIG. 3D is a diagram showing a correction method adopted for a stage.

FIG. 3A is a diagram showing an ideal state. FIG. 3B is a diagram showing a state with no correction. FIG. 3C is a diagram showing a state obtained as a result of correction of a gain error. FIG. 3D is a diagram showing offset correction of a middle segment. The horizontal axis represents the input voltage Vin and the vertical axis represents the output Vres. As shown in FIG. 3A, in an ideal state with no errors, the following conditions hold true:

(i): There is no gain error so that the gradient (gain) has a fixed value of 2.

(ii): There is no offset of segment 1 and, for an input of 0, the output is also 0.

(iii): There is no offset of segment 0 and an output error on the boundary between segments 0 and 1 is a constant of VR. If the straight line in segment 0 is shifted by a distance of −VR with its gradient kept as it is, the straight line will become a continuation line of an output straight line in segment 1.

(iv): There is no offset of segment 2 and an output error on the boundary between segments 1 and 2 is the constant of VR. If the straight line in segment 2 is shifted by a distance of VR with its gradient kept as it is, the straight line will become a continuation line of an output straight line in segment 1.

If an error exists as shown in FIG. 3B, on the other hand, with the error not corrected, the following conditions hold true:

(i): The gradient is not 2 due to a gain error.

(ii): In the case of segment 1, for an input of 0, the output is not 0.

(iii): Even if the straight line in segment 0 is shifted by a distance of −VR with its gradient kept as it is, the straight line will not become a continuation line of an output straight line in segment 1.

(iv): Even if the straight line in segment 2 is shifted by a distance of VR with its gradient kept as it is, the straight line will not become a continuation line of an output straight line in segment 1.

(1): Correction of a Gain Error

As shown in FIG. 3C, a gain error is corrected so as to provide a gain of 2. A gain error is corrected not by correcting the analog unit 10, but by correcting digital values stored in the digital-value storage register 30#i employed in the digital unit 12 where i=0 to N.

(i): A gain αi of the stage 14#i subjected to the gain correction is measured as follows. The gradient (gain) αi is measured from two input values and their output values for segment 1. For example, the two input values are VR/4 and −VR/4. To be more specific, the gradient αi is found as a result of dividing the difference between the two output values by the difference between the input values. However, the difference between the two output values is divided by the difference between the input values not at an analog level, but after converting the values into digital data.

To put it in detail, the output values are computed by the error-computation control unit 34 on the basis of digital-converted data output by the addition-processing unit 32 as a result of summing up digital values corresponding to segment numbers Dj generated by the subsequent stages 14#j where j=(i+1) to N when the two input values are supplied to the stage 14#i. By the same token, input values for the stage 14#(i+1) are computed by the error-computation control unit 34 on the basis of digital-converted data output by the addition-processing unit 32 as a result of summing up digital values corresponding to segment numbers Dj generated by the subsequent stages 14#j where j=(i+2) to N when two input values are supplied to the stage 14#(i+1). Since the input values are known, their digital values can also be found by computation in advance.

(ii): The error-computation control unit 34 computes a gain-error coefficient βi (=αi/α0) where α0 is an ideal gain of 2.

(iii): An input to the stage 14#(i+1) following the stage #14i thus has a magnitude βi times the ideal value where βi is the gain-error coefficient computed above. Accordingly, digital-converted values or the magnitude of the digital-converted data produced by the addition-processing unit 32 is βi times the ideal value. In order to prevent digital output values from including gain errors of subsequent stages 14#j where j=(i+1) to N, errors caused by the gain errors of the subsequent stages 14#j are corrected. That is to say, the error-computation control unit 34 updates a digital value stored in the digital-value storage registers 30#j for each of the subsequent stages 14#j where j=(i+1) to N by multiplying the value by 1/βi. Thus, as shown in FIG. 3C, the gain error of the stage 14#i is corrected to provide a constant ideal gain of 2 for all the stages 14#i.

Since it is feared that the computation of 1/βi consumes much power, 1/βi can be computed by approximation to the n-th power of Eq. (I) given below:

$$1/\beta i = 1 \cdot (1+x) = 1-x+x^2-x^3 \quad . \text{(I)}$$

(2): Correction of an Offset of Segment 1

An offset value of segment 1 in a stage 14#i is an output, which is generated by the stage 14#i when an input of 0 is supplied to the stage 14#i. These outputs appear as segment numbers Dj of the subsequent stages 14#j where j=(i+1) to N. At that time, digital values corresponding to the segment numbers Dj are summed up by the addition-processing unit 32, which outputs offset digital-converted data to the error-computation control unit 34. It is thus necessary to correct the offsets out off the subsequent stages 14#j so as to prevent offset values generated by the subsequent stages 14#j from being included in the digital-converted data. That is to say, the error-computation control unit 34 updates a digital value, which is stored in the digital-value storage register 30#i and corresponds to segment 1, by subtracting the offset digital-converted data from the digital value for each of the stages 14#i. As a result, as shown in FIG. 3D, the offset of segment 1 of the stage 14#i is corrected so that an input of 0 will result in an output of 0.

(3): Correction of an Offset of Segment 0

(i): An output, which is generated by the stage 14#i when an analog input in segment 0 on the boundary between segments 0 and 1 is supplied to the stage 14#i, appears as a segment number Dj of each of the subsequent stages 14#j where j=(i+1) to N. At that time, digital values indicated by the segment numbers Dj are summed up by the addition-processing unit 32, which outputs digital-converted data 1 to the error-computation control unit 34.

(ii): An output, which is generated by the stage 14#i when an analog input in segment 1 on the boundary between segments 0 and 1 is supplied to the stage 14#i, appears as a segment number Dj of each of the subsequent stages 14#j where j=(i+1) to N. At that time, digital values indicated by the segment numbers Dj are summed up by the addition-processing unit 32, which outputs digital-converted data 0 to the error-computation control unit 34.

(iii): The error-computation control unit 34 computes a first difference between digital-converted data 0 and digital-converted data 1. The error-computation control unit 34 then computes a second difference between the first difference and digital-converted data, which is obtained when the constant value VR is supplied to the subsequent stage 144(i+1). Finally, the error-computation control unit 34 updates a digital value stored in the digital-value storage register 30#i corresponding to segment 0 by subtracting the second difference from the digital value for each of the stages 14#i. In this way, the output value of segment 0 is shifted in the negative direction by a digital value of VR with the gradient of the output value kept as it is to become a seamless continuation of the output value of segment 1.

(4): Correction of an Offset of Segment 2

(i): An output, which is generated by the stage 14#i when an analog input in segment 1 on the boundary between segments 1 and 2 is supplied to the stage 14#i, appears as a segment number Dj of each of the subsequent stages 14#j where j=(i+1) to N. At that time, digital values indicated by the segment numbers Dj are summed up by the addition-processing unit 32, which outputs digital-converted data 3 to the error-computation control unit 34.

(ii): An output, which is generated by the stage 14#i when an input in segment 2 on the boundary between segments 1 and 2 is supplied to the stage 14#i, appears as a segment number Dj of each of the subsequent stages 14#j where j=(i+1) to N. At that time, digital values corresponding to the segment numbers Dj are summed up by the addition-processing unit 32, which outputs digital-converted data 2 to the error-computation control unit 34.

(iii): The error-computation control unit 34 computes a first difference between digital-converted data 3 and digital-converted data 2. The error-computation control unit 34 then computes a second difference between the first difference and digital-converted data, which is obtained when the constant value VR is supplied to the subsequent stage 14#(i+1). Finally, the error-computation control unit 34 updates a digital value stored in the digital-value storage register 30#i corresponding to segment 2 by adding the second difference to the digital value for each of the stages 14#i. In this way, the output value of segment 2 is shifted in the positive direction by a digital value of VR with the gradient of the output value kept as it is to become a seamless continuation of the output value of segment 1.

As described above, in the A/D conversion, a digital value stored in the digital-value storage register 30#i is updated by replacing the digital value with a new value completing gain and offset corrections. Thus, the A/D conversion can be carried out without performing processing such as multiplications and additions for correction purposes.

Figure 4:
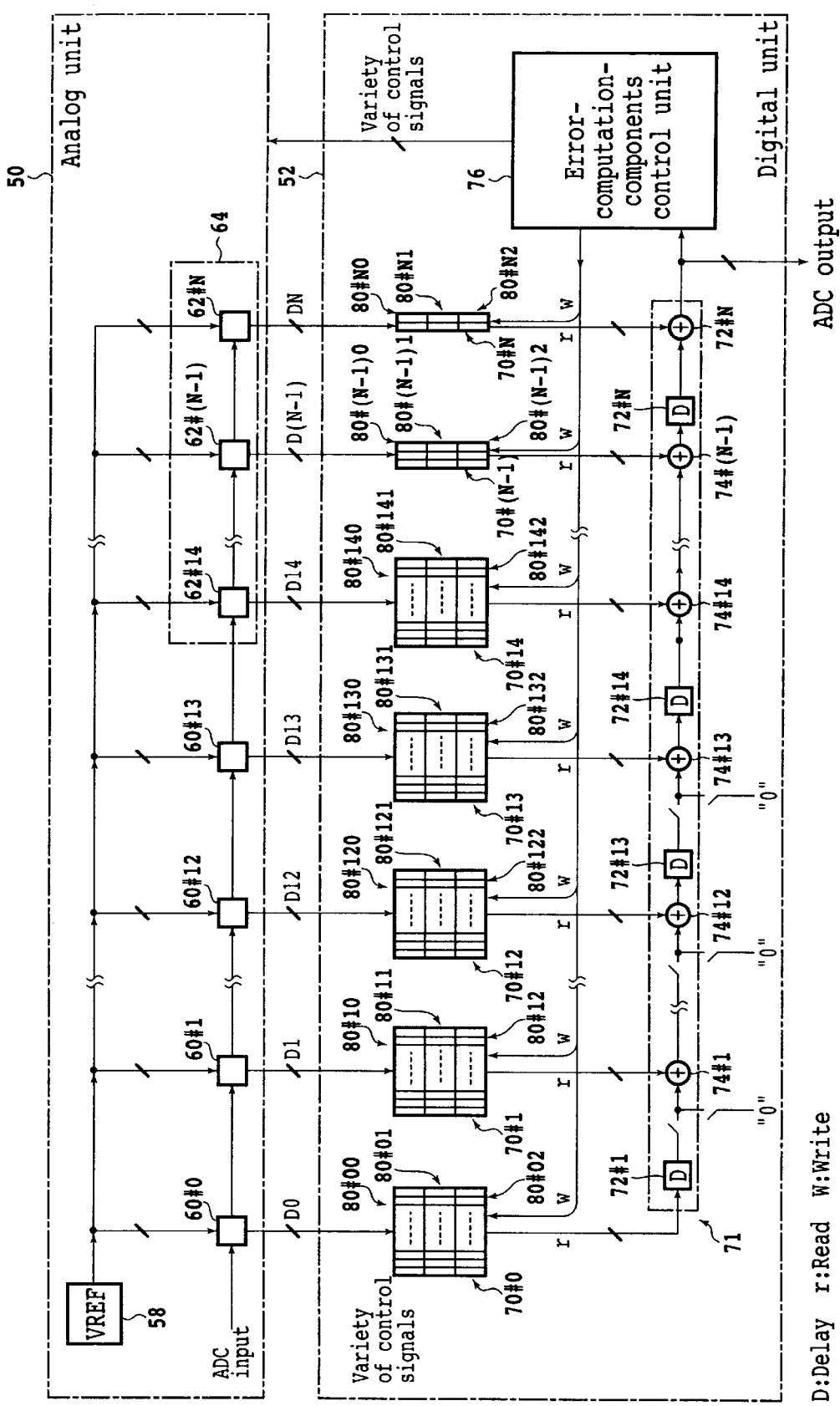
FIG. 4 is a block diagram showing a typical configuration of an A/D converter implemented by an embodiment of the present invention.

FIG. 4 is a block diagram showing a typical configuration of an A/D converter having an error automatic calibration function as implemented by an embodiment of the present invention. As shown in FIG. 4, the A/D converter comprises an analog unit 50 and a digital unit 52. The analog unit 50 comprises a VREF circuit 58, a plurality of stages 60i where i=0 to 13 and a plurality of calibration-purpose later stages 62#i where i=14 to N. The calibration-purpose later stages 62#i where i=14 to N form a calibration-purpose later stage 64. The fourteen stages 60#i where i=0 to 13 are used to realize 14-bit precision. N is typically 17 to provide four calibration-purpose later stages 62#14 to 62#17 forming the calibration-later stage 64 having 4-bit precision. It is to be noted that, in order to reduce power consumption, it is possible to provide a scheme in which the calibration-purpose later stages 62#14 to 62#17 operate only during a calibration and do not operate in an A/D conversion.

Figure 5:
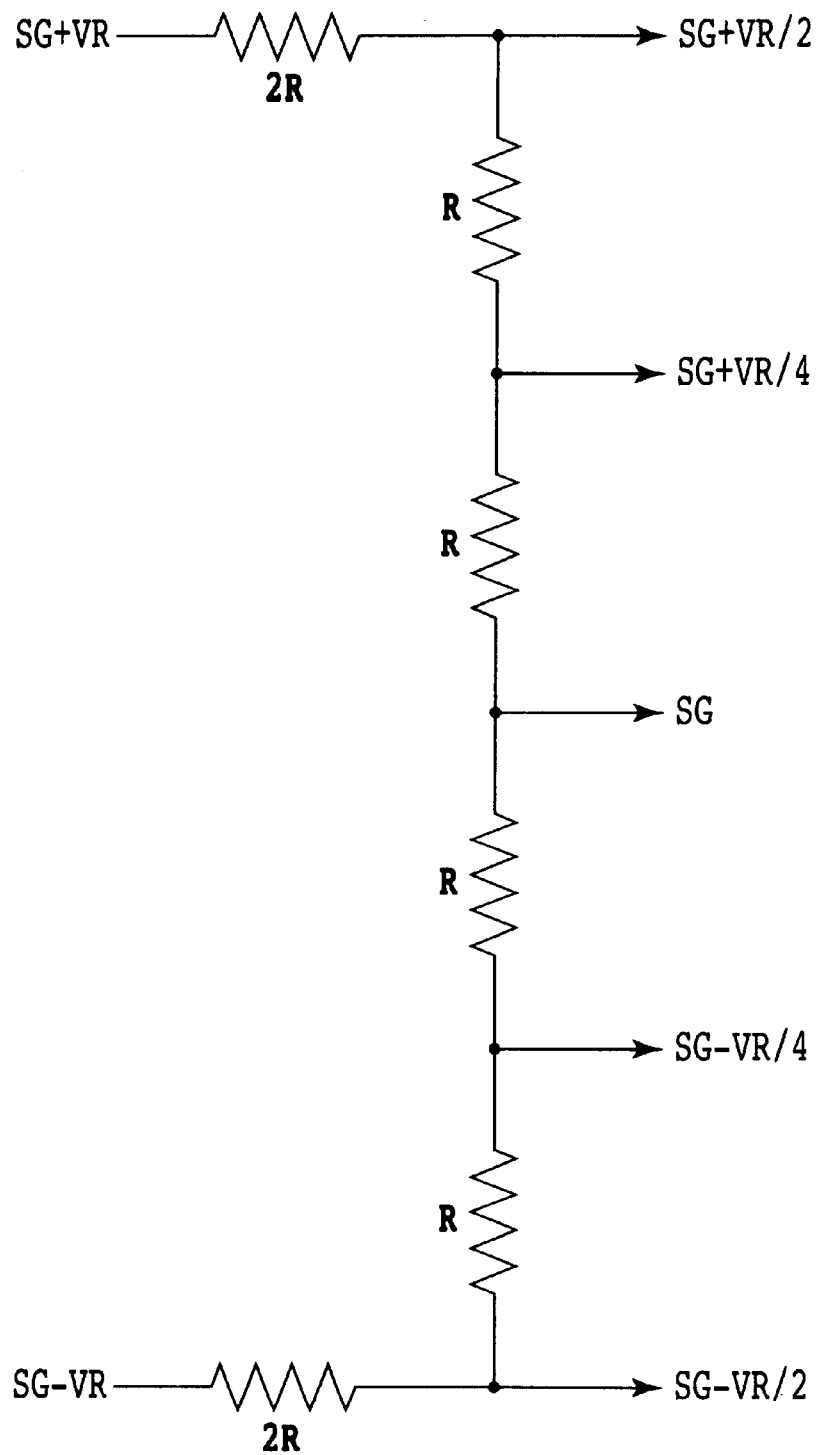
FIG. 5 is a diagram showing the configuration of a VREF circuit employed in the A/D converter shown in FIG. 4.

FIG. 5 is a diagram showing the configuration of the VREF circuit 58 employed in the A/D converter shown in FIG. 4. The VREF circuit 58 comprises two 2R potentiometer resistors and four R potentiometer resistors. Voltages SG+VR and SG−VR are applied to the two 2R potentiometer resistors respectively where notation SG denotes the electric potential of the signal ground. Electric potentials SG+VR/2, SG+VR/4, SG, SG−VR/4 and SG−VR/2 appear at the five junctions among these four R potentiometer resistors. Used as reference voltages, these electric potentials are supplied to the stages 60#i where i=0 to 13 and the calibration-purpose later stages 62#i where i=14 to N. The stages 60#i where i=0 to 13 and the calibration-purpose later stages 62#i where i=14 to N are virtually identical with each other. For example, in the 1.5-bit A/D conversion, a stage 60#i and a calibration-purpose later stage 62#i output a signal below to a subsequent stage 60#(i+1) and a calibration-purpose later stage 62#(i+1) respectively:

2×Vin+VR in the case of an input analog signal Vin of segment 0,

2×Vin in the case of an input analog signal Vin of segment 1, or

2×Vin−VR in the case of an input analog signal Vin of segment 2.

At the same time, the stage 60#i and the calibration-purpose later stage 62#i each output a digital signal Di representing the number of a segment in which the input signal Vin lies, to the digital unit 52.

Figure 6:
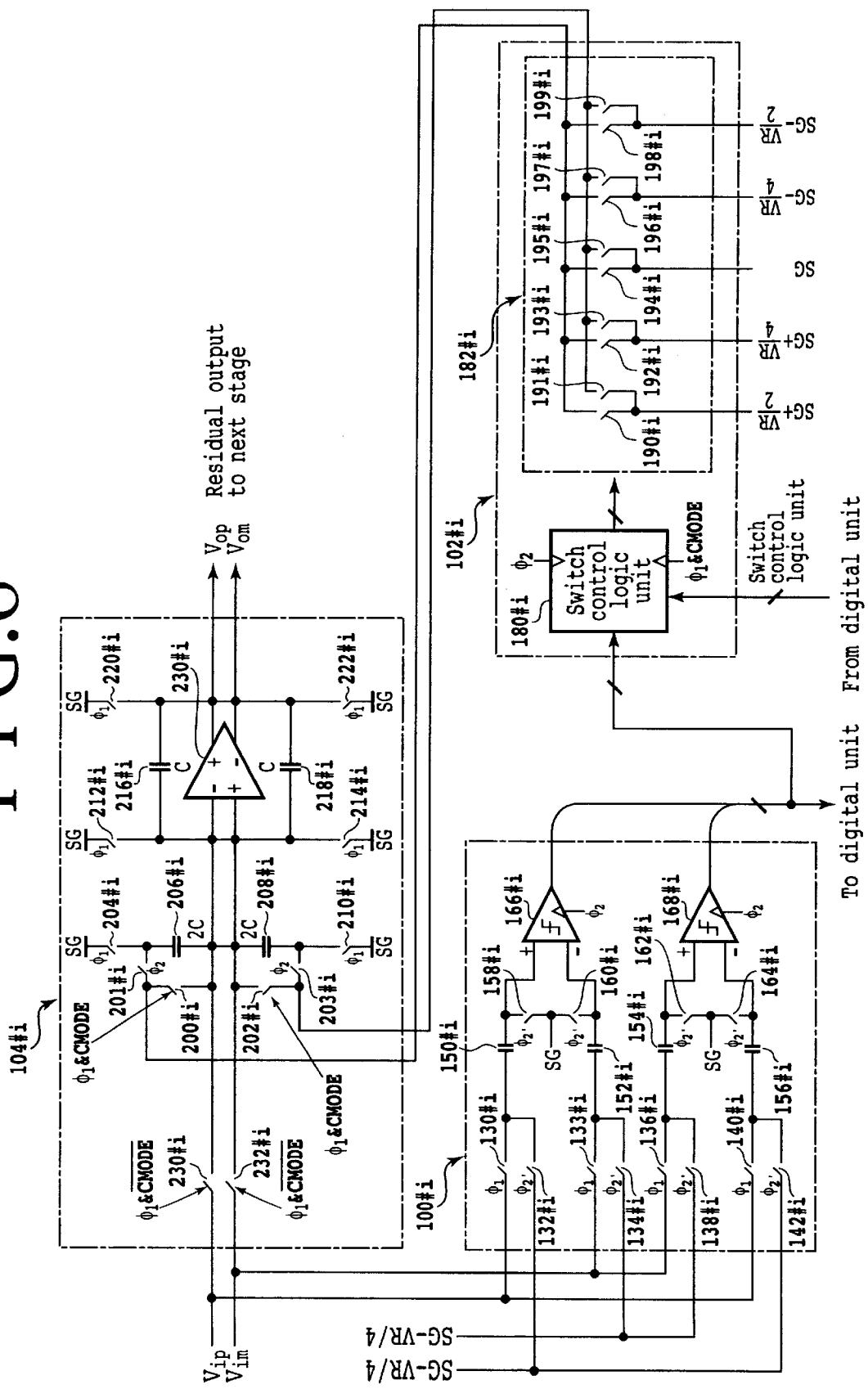
FIG. 6 is a block diagram showing a typical configuration of a stage of the A/D converter shown in FIG. 4.
Figure 7:
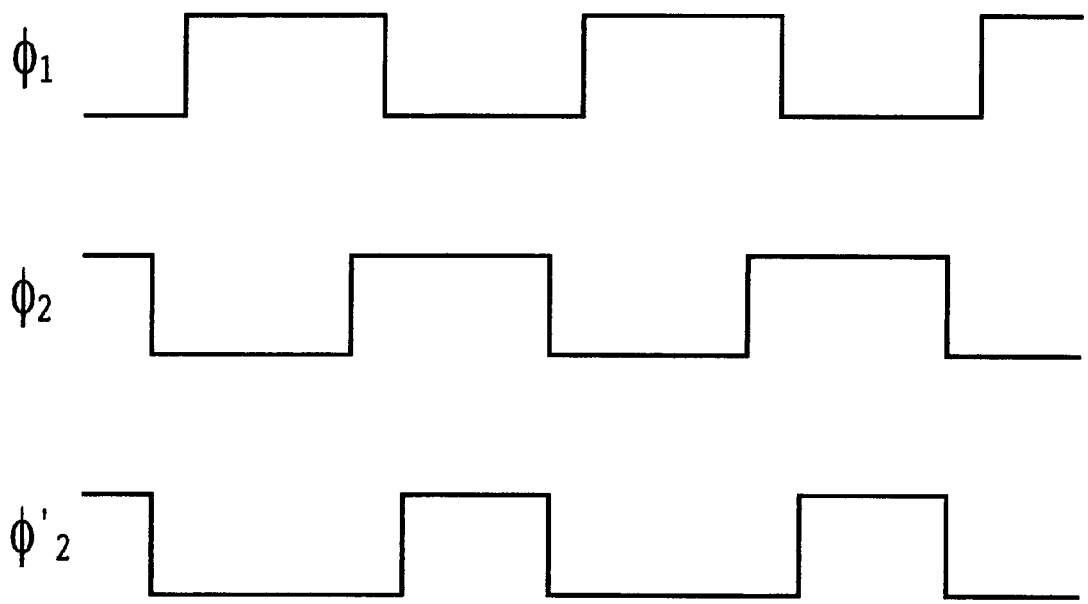
FIG. 7 is time charts of clock signals used in the stage shown in FIG. 6.

FIG. 6 is a block diagram showing a typical configuration of the stage 60#i or the calibration-purpose later stage 62#i employed in the A/D converter shown in FIG. 4. FIG. 7 is a diagram showing waveforms of clock signals φ1, φ2 and φ2' used in the stage 60#i shown in FIG. 6. As shown in FIG. 6, the stage 60#i and the calibration-purpose later stage 62#i each comprise a sub-ADC 100#i, a sub-DAC 102#i and an adder & amplifier circuit 104#i. The sub-ADC 100#i has switches 130#i to 142#i, capacitors 150#i to 156#i, switches 158#i to 164#i as well as clock comparators 166#i and 168#i. The sub-ADC 100#i carries out the following processing:

(i): Electrically charge the capacitors 150#i, 152#i, 154#i and 156#i by applying the reference voltage SG+VR/4 or SG−VR/4 at phase φ2'.

(ii): Apply an input voltage Vip or Vim to the capacitors 150#i, 152#i, 154#i and 156#i at phase φ1.

(iii): Subtract a voltage appearing at the minus terminal of the clock comparator 166#i from the plus terminal of the same clock comparator and subtract a voltage appearing at the minus terminal of the clock comparator 168#i from the plus terminal of the same clock comparator as well as outputs a segment number Di at phase φ2.

The sub-DAC 102#i includes a switch control logic circuit 180#i and a DAC 182#i. In accordance with a switch forcible control signal output by an error-computation-components control unit 76, the switch control logic circuit 180#i outputs a switch signal resulting in an effect described below to the DAC 182#i. Output by the error-computation-components control unit 76, the switch forcible control signal is a signal that:

(i): in a calibration, invalidates a segment number Di output by the sub-ADC 100#i and puts the DAC 182#i in a calibration mode for forcibly controlling the DAC 182#i, and (ii): includes a signal CMODE for distinguishing a mode for validating a segment number Di.

Notation CMODE with a line drawn above the character string CMODE denotes the inverted signal of a signal CMODE. In the following description, the inverted signal of the signal CMODE is denoted by notation CMODEB in place of notation CMODE with a line drawn above the character string CMODE.

In the calibration mode, the switch forcible control signal includes a signal indicating which of the switches 190#i to 199#i employed in the DAC 182#i is to be turned on in order to carry out a gain-error correction and/or an offset correction.

(i): Gain-error Correction (1): The DAC 182#i is controlled so that, in order to obtain an output for an input in segment 1 on a boundary between segments 1 and 2, at phase φ1 & CMODE, a voltage SG+VR/4 is applied to a switched capacitor 206#i whereas a voltage SG−VR/4 is applied to a switched capacitor 208#i and, at phase φ2, a voltage SG is applied to both the switched capacitors 206#i and 208#i.

(2): The DAC 182#i is controlled so that, in order to obtain an output for an input in segment 1 on a boundary between segments 1 and 0, at phase φ1 & CMODE, the voltage SG−VR/4 is applied to the switched capacitor 206#i whereas the voltage SG+VR/4 is applied to the switched capacitor 208#i and, at phase φ2, the voltage SG is applied to both the switched capacitors 206#i and 208#i.

(3): The DAC 182#i is controlled so that, in order to obtain an input analog signal Vip equal to VR/4 (Vip=VR/4) at the preceding stage 60#(i−1), at phase φ1 & CMODE, the voltage SG+VR/4 is applied to the switched capacitor 206#i whereas the voltage SG−VR/4 is applied to the switched capacitor 208#i and, at phase φ2, the voltage SG is applied to both the switched capacitors 206#i and 208#i.

(4): The DAC 182#i is controlled so that, in order to obtain an input analog signal Vip equal to −VR/4 (Vip=−VR/4) at the preceding stage 60#(i−1), at phase φ1 & CMODE, the voltage SG−VR/4 is applied to the switched capacitor 206#i whereas the voltage SG+VR/4 is applied to the switched capacitor 208#i and, at phase φ2, the voltage SG is applied to both the switched capacitors 206#i and 208#i.

(ii): Offset Correction of Segment 1

The DAC 182#i is controlled so that, in order to obtain an output for an input of 0 in segment 0, at phase φ1 & CMODE and at phase φ2, the voltage SG is applied to both the switched capacitors 206#i and 208#i.

(iii): Offset Correction of Segment 0

(1): The DAC 182#i is controlled so that, in order to obtain an output for an input in segment 1 on a boundary between segments 0 and 1, at phase φ1 & CMODE, the voltage SG−VR/4 is applied to the switched capacitor 206#i whereas the voltage SG+VR/4 is applied to the switched capacitor 208#i and, at phase φ2, the voltage SG is applied to both the switched capacitors 206#i and 208#i.

(2): The DAC 182#i is controlled so that, in order to obtain an output for an input in segment 0 on a boundary between segments 0 and 1, at phase φ1 & CMODE, the voltage SG−VR/4 is applied to the switched capacitor 206#i whereas the voltage SG+VR/4 is applied to the switched capacitor 208#i and, at phase φ2, a voltage SG−VR/2is applied to the switched capacitor 206#i whereas a voltage SG+VR/2 is applied to the switched capacitor 20βi.

(iv): Offset Correction of Segment 2

(1): The DAC 182#i is controlled so that, in order to obtain an output for an input in segment 1 on a boundary between segments 1 and 2, at phase φ1 & CMODE, the voltage SG+VR/4 is applied to the switched capacitor 206#i whereas the voltage SG−VR/4 is applied to the switched capacitor 208#i and, at phase φ2, the voltage SG is applied to both the switched capacitors 206#i and 208#i.

(2): The DAC 182#i is controlled so that, in order to obtain an output for an input in segment 2 on a boundary between segments 1 and 2, at phase φ1 & CMODE, the voltage SG+VR/4 is applied to the switched capacitor 206#i whereas the voltage SG−VR/4 is applied to the switched capacitor 208#i and, at phase φ2, the voltage SG+VR/2 is applied to the switched capacitor 206#i whereas the voltage SG−VR/2 is applied to the switched capacitor 208#i.

If the segment number Di is valid, on the other hand, the DAC 182#i is controlled as follows:

(i): In the case of segment 0, the DAC 182#i is controlled so that, at phase 42, the voltage SG−VR/2 is applied to the switched capacitor 206#i whereas the voltage SG+VR/2 is applied to the switched capacitor 208#i.

(ii): In the case of segment 1, the DAC 182#i is controlled so that, at phase φ2, a voltage SG is applied to both the switched capacitor 206#i and the switched capacitor 208#i.

(iii): In the case of segment 2, the DAC 182#i is controlled so that, at phase φ2, the voltage SG+VR/2 is applied to the switched capacitor 206#i whereas the voltage SG−VR/2 is applied to the switched capacitor 208#i.

It is to be noted that, in order to execute control to prevent the calibration-purpose later stage 62#i where i=14 to N from operating in a D/A conversion, the switch forcible control signal is generated as a command signal to turn off the switches 190#i to 199#i employed in the DAC 182#i. The DAC 182#i comprises switches 190#i to 199#i, which are controlled by the switch control logic circuit 180#i to output an analog signal from the voltages SG+VR/2, SG+VR/4, SG−VR/4, and SG−VR/2 applied to the switches 190#i to 199#i.

The adder & amplifier circuit 104#i comprises switches 230#i, 232#i, 200#i, 201#i, 202#i, 203#i, 204#i, 210#i, 212#i and 214#i, switched capacitors (input capacitors) 206#i and 208#i, feedback capacitors 216#i and 218#i, switches 220#i and 222#i as well as an all differential operational amplifier 230#i. The adder & amplifier circuit 104#i operates as follows.

(1): Phase φ1 and Phase φ1 & CMODE

At phase φ1 & CMODEB, the switches 230#i and 232#i are turned on and, at phase φ1 & CMODE, the switches 200#i and 202#i are turned on. In addition, at phase φ1, the switches 204#i, 210#i, 212#i, 214#i, 220#i and 222#i are turned on. Furthermore, a sampling operation is carried out by electrically charging the input capacitors 206#i and 208#i each having a capacity of 2C and electrically discharging the feedback capacitors 216#i and 218#i each also having a capacity of C.

(2): Phase 2

Part of electric charge accumulated in the input capacitors 206#i and 208#i during a sampling operation is transferred to the feedback capacitors 216#i and 218#i respectively. That is to say, electric charge is moved from the input capacitors 206#i and 208#i to the feedback capacitors 216#i and 218#i respectively. At phase φ2, the switches 201#i and 203#i are turned on. In addition, a voltage generated by the DAC 182#i is applied to the input capacitors 206#i and 208#i. The all differential operational amplifier 230#i forms an inversion amplification circuit comprising the input capacitors 206#i and 208#i in addition to the feedback capacitors 216#i and 218#i. The all differential operational amplifier 230#i generates residual output voltages Vop and Vom.

The digital unit 52 employed in the A/D converter shown in FIG. 4 has digital-value storage registers 70#i where i=0 to N, an addition-processing unit 71 and the error-computation-components control unit 76. The digital-value storage register 70#i includes segment registers 80#i0, 80#i1 and 80#i2 for storing digital values for segments 0, 1 and 2 respectively. The digital-value storage register 70#i selects one of the segment registers 80#ij, which corresponds to a segment number Di, where j=0, 1 and 2, and outputs a digital value stored in the selected segment register 80#ij. An initial value of the digital value stored in the segment register 80#ij is an ideal value for a case with neither gain error nor offset. The ideal value is determined in accordance with the operation. Examples of the ideal value are a number expressed in the fixed point format and an integer number. The horizontal width of the segment register 80#ij represents the number of digits (or bits) of the digital value stored in the segment register 80#ij. Typically, all the digits of the digital value are stored in each stage. As an alternative, the number of digits stored in a stage following any particular stage is reduced by 1 in comparison with the number of digits stored in the particular stage as shown in FIG. 4. With such a scheme, the number of digits stored in the digital-value storage register 70#N employed in the last stage 62#N is 2.

The addition-processing unit 71 comprises delay circuits 72#i and adders 74#i where i=1 to N. The delay circuit 72#i delays a digital value of the segment register 80#(i+1)j by a predetermined time. The adder 74#i adds the output of the delay circuit 72#i to the digital value of the segment register 80#ij with the most significant bit of the output aligned to the least significant bit of the digital value. Digital-converted data output by the adders 74#N of the last stage is supplied to the error-computation-components control unit 76 and the outside world as an ADC output. A first switch is provided between the delay circuit 72#i and the adder 74#i whereas a second switch is provided between an all-0 source and the adder 74#i. When the stage 60#(i+1) is calibrated, the first switch is turned off to disconnect the adder 74#i from the delay circuit 72#i while the second switch is turned on to connect the adder 74#i to the all-0 source in order to supply all-0 data to the adder 74#i. In an A/D conversion, on the other hand, the first switch is turned on to connect the adder 74#i to the delay circuit 72#i while the second switch is turned off to disconnect the adder 74#i from the all-0 source.

Figure 8:
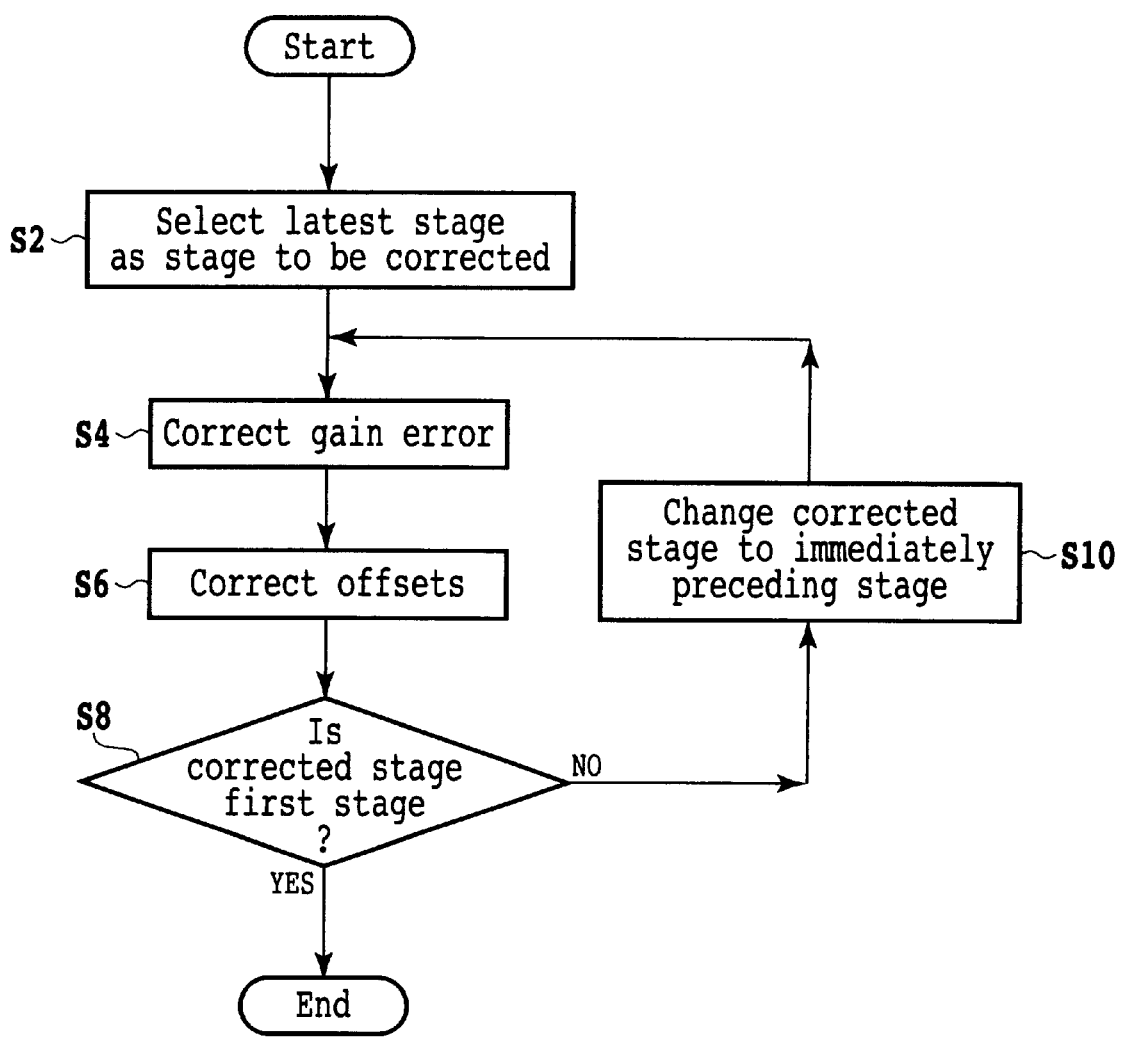
FIG. 8 is a flowchart representing a correction method.
Figure 9A:
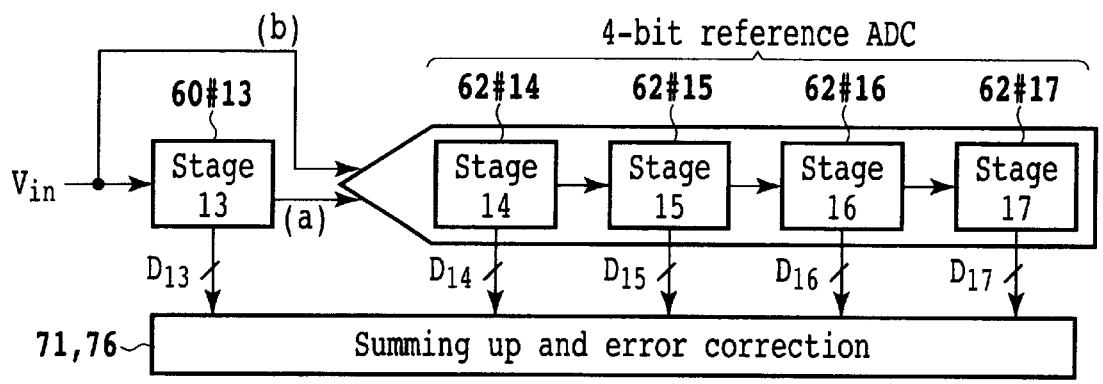
FIG. 9A is a diagram showing a correction procedure.
Figure 9B:
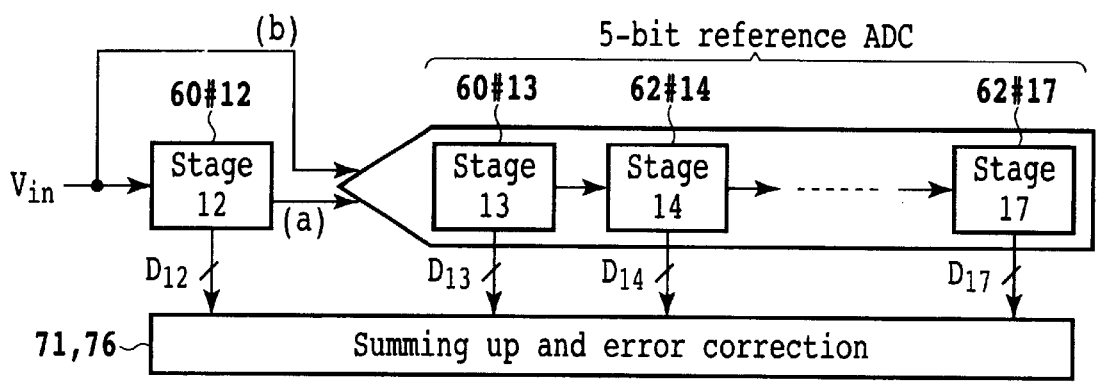
FIG. 9B is a diagram showing another correction procedure.
Figure 9C:
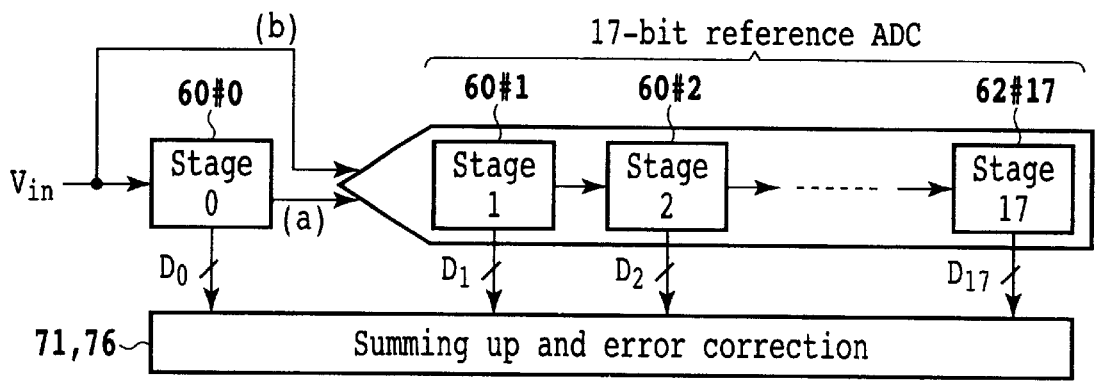
FIG. 9C is a diagram showing a further correction procedure.

The error-computation-components control unit 76 employed in the A/D converter shown in FIG. 4 corrects the gain error and offsets of each of the stages sequentially one stage after another starting with the last stage. FIG. 8 is a flowchart representing a correction method for correcting the gain error and offsets. FIG. 9A is a diagram showing a correction procedure for correcting errors in the stage 60#13. FIG. 9B is a diagram showing a correction procedure for correcting errors in the stage 60#12. FIG. 9C is a diagram showing a correction procedure for correcting errors in the stage 60#0.

(1): The flowchart shown in FIG. 8 begins with a step S2 at which the stage 60#13 is selected as a stage 60#i to be calibrated as shown in FIG. 9A.

(2): Then, at the next step S4, gain errors of stages following the stage 60#13 are corrected. In order to supply an input voltage Vin to the stage 60#13 as shown in (a) of FIG. 9A, a signal CMODE is made active. In order to obtain two output values corresponding to two input values, the switch forcible control signal is output to the stage 60#13 subjected to the correction. In this state, the addition-processing unit 71 outputs digital-converted data as the two output values corresponding to the two input values, to the error-computation-components control unit 76. In order to supply the two input voltages directly to the stage 62#14 as shown in (b) of FIG. 9A, the switch forcible control signal is output to the stage 60#13 subjected to the correction. In this state, the addition-processing unit 71 outputs digital-converted data as the two output values corresponding to the two input values to the error-computation-components control unit 76. The digital values stored in the calibration-purpose later stages 62#14 to 62#17 in this state are each a 4-bit reference ADC value. A gain error coefficient αi is computed from the actual output value and the input value. The digital values stored in the digital-value storage registers 70#i of the calibration-purpose later stages 62#j following the stage 60#13 subjected to the correction where j=14 to N are multiplied by the reciprocal 1/αi of the gain error coefficient αi.

(3): Then, at the next step S6, offsets of segments 0, 1 and 2 in the stage 60#13 subjected to the correction and its subsequent stages 62#j are corrected. In order to supply an input voltage Vin to the stage 60#13 as shown in (a) of FIG. 9A, a signal CMODE is made active. In order to correct offsets of segments 0, 1 and 2, the switch forcible control signal is output to the stage 60#13 subjected to the correction. The error-computation-components control unit 76 inputs digital-converted data from the addition-processing unit 71, computes offsets of segments 0, 1 and 2 and updates the digital values stored in the segment registers 80#130, 80#131 and 80#132. It is to be noted that the stage 60#13 is controlled so that:

in order to correct the offset of segment 1, an input voltage Vin of 0 is input;

in order to correct the offset of segment 0, an input voltage Vin in segment 1 on the boundary between the segments 0 and 1 and an input voltage Vin in segment 0 on the boundary between the segments 0 and 1 are input; and in order to correct the offset of segment 2, an input voltage Vin in segment 1 on the boundary between the segments 1 and 2 and an input voltage Vin in segment 2 on the boundary between the segments 1 and 2 are input.

Then, at the next step S8, the stage 60#i subjected to correction is examined to form a judgment as to whether or not the stage 60#i is the first stage. If the stage 60#i is the first stage, the correction processing is ended. If the stage 60#i is not the first stage, on the other hand, the flow of the correction processing goes on to a step S10. At the step S10, the immediately preceding stage 60#(i−1) is taken as a stage subjected to a correction. Then, at the next step S4, gain errors of the stages following the stage 60#12 are corrected and, at the next step S6, offsets of the stage 60#12 are corrected as shown in FIG. 9B. The gain error and offsets are corrected in the same way as what is described above for the stage 60#13. In this correction, the digital values stored in the stages 60#13 and 62#14 to 62#17 are each a 5-bit reference ADC value. Since the stage 60#13 completed gain-error and offset corrections, however, the precision of the error corrections for the stage 60#13 by no means deteriorates. Then, the stages 60#11 to 60#1 are also subjected to gain-error and offset corrections in the same way as the stages 60#13 and 60#12 described above. Finally, as shown in FIG. 9C, the stage 60#0 is subjected to gain-error and offset corrections in the same way as the stages 60#13 to 60#1. In this correction, the digital values stored in the stages 60#1 to 60#13 and 62#14 to 62#17 are each a 17-bit reference ADC value.

In general, the operational amplifier's gain and band increase in proportion to the magnitude of a bias current flowing through the amplifier. In a measurement of an early stage's residual errors and input reference, by the way, the precision of a later stage or a stage on the LSB side may be required to be higher than the precision for an A/D conversion. In order to meet such a demand, control may be executed to increase the bias current of the operational amplifier during a calibration requiring high precision and switch the bias current to a small magnitude during an A/D conversion in which power consumption needs to be reduced.

Digital values completing the gain-error and offset corrections carried out on the stages 60#i where i=0 to 13 as described above are stored in the digital-value storage registers 70#i. Thus, in an A/D conversion, corrections are not required. That is to say, the corrected digital values are merely read out from the digital-value storage registers 70#i to be summed up. In addition, in an A/D conversion, the calibration-purpose later stages 62#14 to 62#N can be put in an inoperative state.

Figure 10:
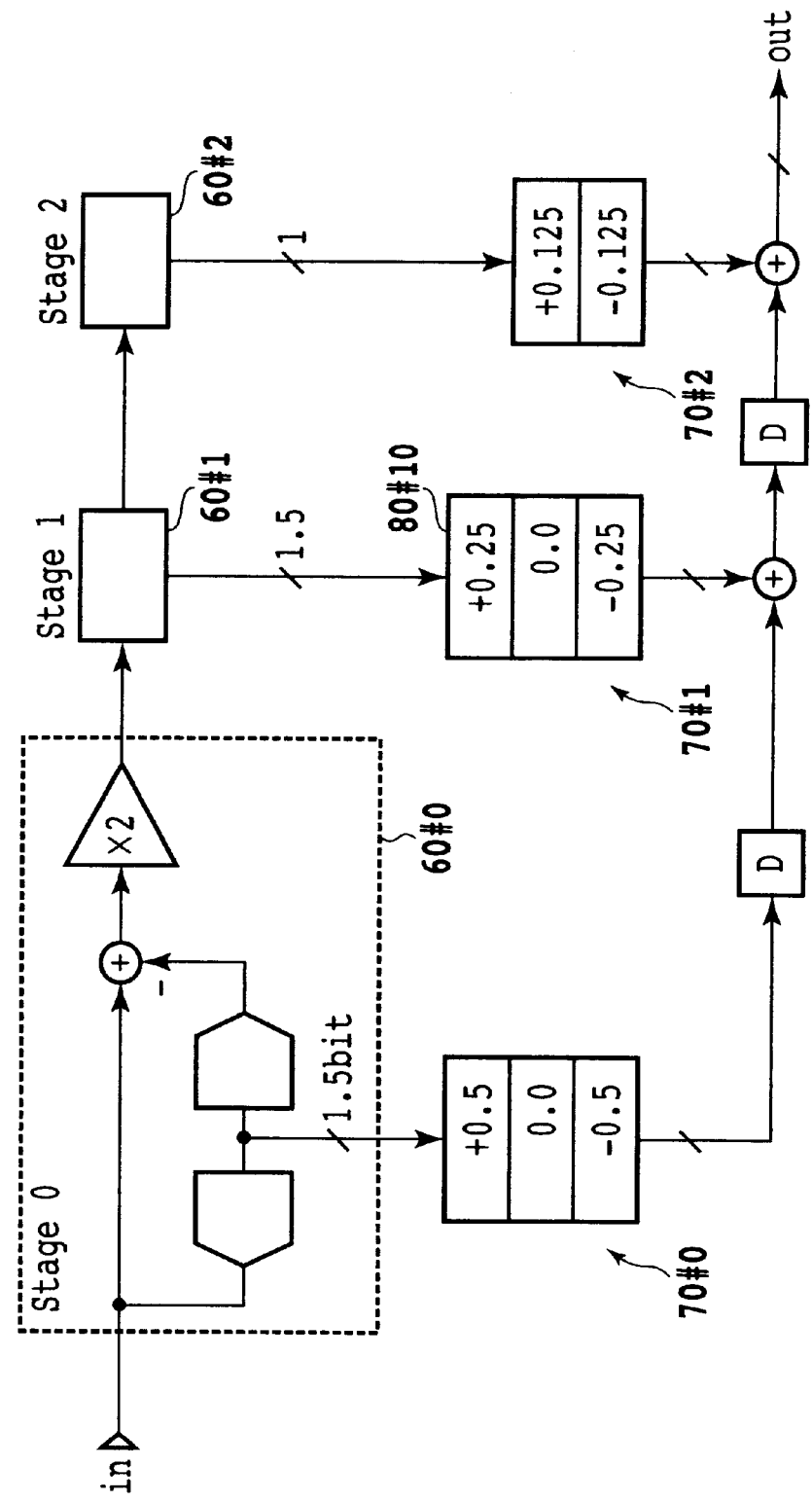
FIG. 10 is a diagram showing an example of correction.
Figure 11:
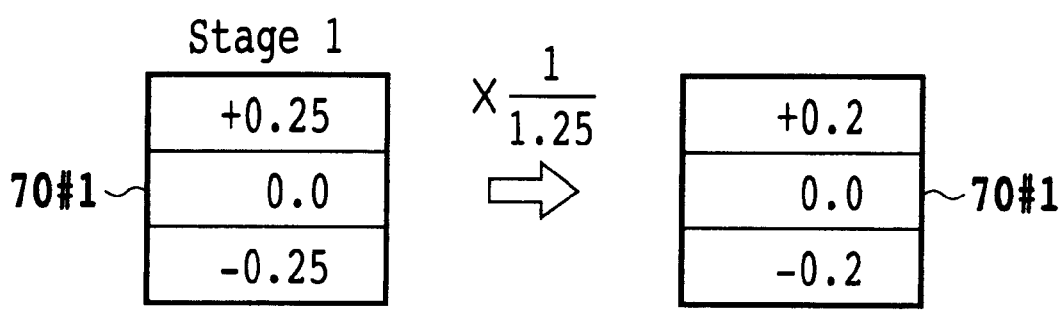
FIG. 11 is a diagram showing another example of correction.
Figure 11:
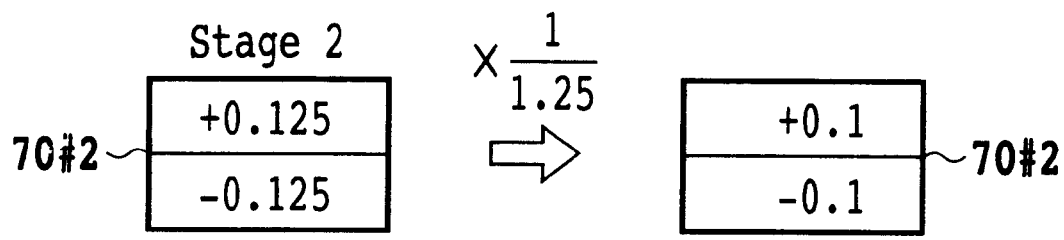
Figure 12:
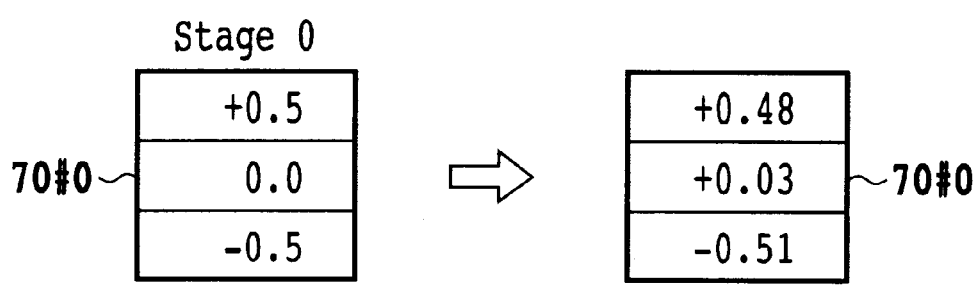
FIG. 12 is a diagram showing a further example of correction.
Figure 12:
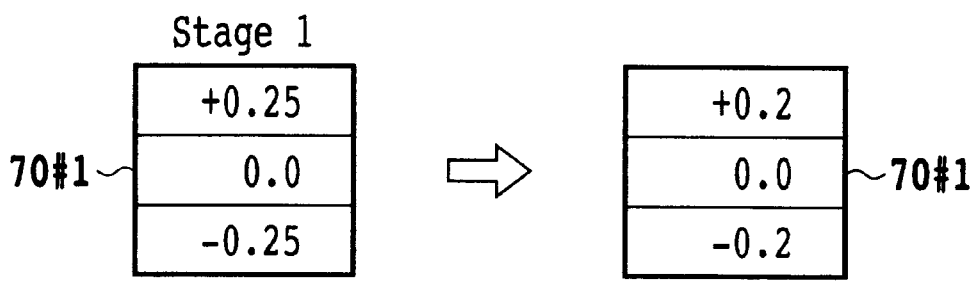
Figure 12:
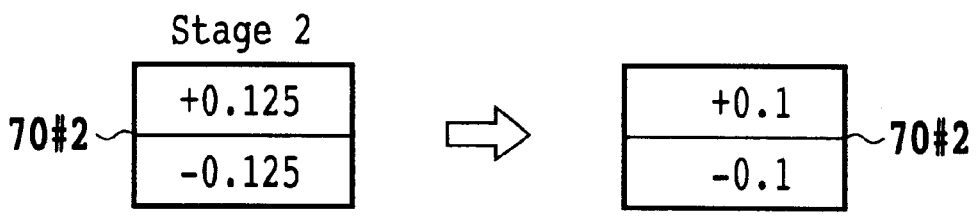

FIGS. 10 to 12 are each a diagram showing an embodiment implementing gain-error and offset corrections. For the sake of brevity, it is assumed that the A/D converter has a 3-stage configuration like one shown in FIG. 10 and the output of the A/D conversion can be one of 15 steps, which are separated from each other by $\frac{1}{8}$ and range from $-\frac{7}{8}$ to $+\frac{7}{8}$. Typical ideal values of digital values expressed in the fixed point format are shown in FIG. 10. As shown in the figure, the typical ideal values of digital values stored in the digital-value storage register 70#0 of stage 0 are +0.5, 0 and −0.5 for segments 0, 1 and 2 respectively. The typical ideal values of digital values stored in the digital-value storage register 70#1 of stage 1 are +0.25, 0 and −0.25 for segments 0, 1 and 2 respectively. The typical ideal values of digital values stored in the digital-value storage register 70#2 of stage 2 are +0.125 and −0.125 for segments 0 and 2 respectively. Let a gain error exist in stage 0 with a gain-error coefficient of typically 1.25. In this case, the analog output of the first stage is 1.25 times the magnitude of an analog output for a case with no error. Thus, the digital-converted value obtained through the succeeding stages needs to be reduced by a factor corresponding to the magnification of 1.25. To put it in detail, as shown in FIG. 11, with stage 0 having a gain-error coefficient of 1.25, the digital values stored in the digital-value storage register 70#1 of stage 1 for segments 0, 1 and 2 are divided by 1.25 to produce corrected digital values of +0.2, 0 and −0.2 respectively. By the same token, the digital values stored in the digital-value storage register 70#2 of stage 2 for segments 0 and 2 are divided by 1.25 to produce corrected digital values of +0.1 and −0.1 respectively.

Assume that, with stage 0 having a gain-error coefficient of 1.25, the offsets of segments 0, 1 and 2 in stage 0 are +0.02, −0.03 and +0.01 respectively as shown in FIG. 12. As described above, the digital values stored in the digital-value storage register 70#1 of stage 1 and the digital-value storage register 70#2 in stage 2 are corrected only in accordance with the gain error of stage 0 so that these values do not change from those shown in FIG. 10. In order to cancel the offsets of stage 0, the digital values stored in the digital-value storage register 70#0 of stage 0 itself for segments 0, 1 and 2 are changed to +0.48, +0.03 and −0.51 respectively.

As described above, the embodiments adopt the 1.5-bit A/D conversion technique whereby the input is classified into three segments. It is to be noted that the present invention can also be applied to a technique whereby the input is classified into more than three segments. For example, the input is generally classified into seven segments as additional redundancy in order to provide 2-bit precision to each stage. In such a case, a gain error and an offset are corrected, starting with the middle segment in a direction toward the segments on outer sides with respect to the middle segment.

In accordance with the present invention described above, corrected digital values are each stored in a digital-value storage register in advance. Thus, in an A/D conversion, corrections are not required so that power consumption can be reduced.

The present invention is not limited to the details of the above described preferred embodiments. That is to say, the scope of the present invention is defined by appended claims and all changes as well as modifications falling within the equivalence of the scope of the claims are therefore to be embraced by the invention.

What is claimed is:

1. An analog/digital converter comprising an analog conversion unit including a plurality of stages having a pipelined configuration and a digital conversion unit, wherein each of said stages includes:
    a sub-analog/digital converter for outputting a segment number corresponding to the level of a first analog signal;
    a sub-digital/analog converter for outputting a second analog signal corresponding to said segment number; and
    an amplifier circuit for adding said second analog signal to said first analog signal to produce a sum analog signal and amplifying said sum analog signal at a predetermined gain, and
wherein said digital conversion unit includes:
    digital-value storage registers, which are each provided for one of said stages, each of said registers used for storing a digital value completing error correction for a segment and being adapted to output said digital value that corresponds to said segment number,
    an addition-processing unit for summing up said digital values output for all said stages from said specific digital-value storage registers to output digital-converted data; and
    an error-computation control unit for controlling said stages so that a specific one of said stages inputs an error computation analog, signal when said digital value stored in said digital-value storage registers corresponding to said specific stage is to be corrected, computing an error of said specific stage on the basis of said digital-converted data computed by said addition-processing unit which sums up said digital values on the basis of said error computation analog signal output by said digital-value storage registers, in accordance with said segment numbers received from all said stages following said specific stage and updating said digital values stored in said digital-value storage registers associated with all said stages following said specific stage in order to cancel said error of said specific stage.

2. An analog/digital converter according to claim 1, wherein said error-computation control unit controls said specific stage in order to compute an actual gain of said amplifier circuit employed in said specific stage from said digital-converted data, computes a ratio of said computed actual gain to an ideal gain of said amplifier circuit employed in said specific stage, and updates said digital values stored in said digital-value storage registers associated with all said stages following said specific stage.

3. An analog/digital converter according to claim 2, wherein said error-computation control unit updates said digital values stored in said digital-value storage registers associated with all said stages following said specific stage by multiplying said digital values stored in said digital-value storage registers associated with all said stages following said specific stage by the reciprocal of said ratio.

4. An analog/digital converter according to claim 3, wherein said error-computation control unit makes a difference between two pieces of digital-converted data at an input point on a boundary between a particular segment and a segment adjacent to said particular segment equal to a predetermined digital value by updating said digital value stored in said digital-value storage register associated with said specific stage and is associated with said segment adjacent to said particular segment, in order to correct an offset for said segment adjacent to said particular segment in said specific stage.

5. An analog/digital converter according to claim 4, wherein said particular segment is a segment at a middle level of a level range of said first analog signal, and wherein said error-computation control unit corrects offsets of segments, starting with said particular segment in directions toward segments on both sides with respect to said particular segment.

6. An analog/digital converter according to claim 2, wherein said error-computation control unit computes the reciprocal of said ratio by using an approximation expressed as a sum of the unity and a polynomial expression of an error coefficient, which is a difference between said ratio and the unity.

7. An analog/digital converter according to claim 2, wherein said error-computation control unit controls said specific stage so as to sequentially supply a first gain-error computation analog signal and a second gain-error computation analog signal to said amplifier circuit employed in said specific stage, produces first digital-converted data and second digital-converted data for said first gain-error computation analog signal and said second gain-error computation analog signal, executes control so as to sequentially supply a third gain-error computation analog signal and a fourth gain-error computation analog signal having the same levels as said first gain-error computation analog signal and said second gain-error computation analog signal to said amplifier circuit employed in said stage immediately following said specific stage, produces third digital-converted data and fourth digital-converted data for said third gain-error computation analog signal and said fourth gain-error computation analog signal, and computes said gain-error coefficient of said specific stage on the basis of said first digital-converted data, said second digital-converted data, said third digital-converted data and said fourth digital-converted data.

8. An analog/digital converter according to claim 1, wherein said error-computation control unit updates said digital value stored in said digital-value storage register which is associated with said specific stage and which is associated with a particular segment, so that said digital-converted data becomes equal to a predetermined digital value when an input analog signal at a particular level corresponding to said particular segment is supplied to said specific stage.

9. An analog/digital converter according to claim 1, wherein said error-computation control unit invalidates said segment number output by said sub-analog/digital converter and outputs a calibration control signal to generate an error-computation analog signal, wherein said amplifier circuit inputs said first analog signal at a first phase, inputs said second analog signal at a second phase and sums up said first analog signal and said second analog signal to produce a sum signal prior to amplification of said sum signal; and wherein said sub-digital/analog converter supplies a third analog signal in place of said first analog signal to said amplifier circuit at said first phase and said second analog signal to said amplifier circuit at said second phase.

10. An analog/digital converter according to claim 1, wherein said plurality of stages comprise a first group of early stages and a second group of stages provided later than said early stages and said second group is a group of calibration-purpose stages used computing errors of said early stages.

11. An analog/digital converter according to claim 10, wherein said group of calibration-purpose stages operates only during an operation to compute errors of said early stages.

12. An analog/digital converter according to claim 1, wherein a bias current flowing through said amplifier circuit during a correction of said error is set at a value greater than the magnitude of said bias current flowing through said amplifier circuit during an analog/digital conversion.

* * * * *